United States Patent [19]

Salanki et al.

[11] Patent Number: 4,757,366
[45] Date of Patent: Jul. 12, 1988

[54] LIGHT-TRIGGERABLE THYRISTOR HAVING LOW-LOSS FEED OF THE TRIGGER ENERGY

[75] Inventors: Tibor Salanki, Erlangen; Reinhold Kuhnert; Heinz Mitlehner, both Munich, all of Fed. Rep. of Germany

[73] Assignee: Siemens Aktiengesellschaft, Berlin and Munich, Fed. Rep. of Germany

[21] Appl. No.: 846,582

[22] Filed: Mar. 31, 1986

[30] Foreign Application Priority Data

Apr. 12, 1985 [DE] Fed. Rep. of Germany ....... 3513219

[51] Int. Cl.4 .................... H01L 29/74; H01L 31/16; H01L 23/10; H01L 29/40
[52] U.S. Cl. ......................................... 357/38; 357/30; 357/74; 357/75; 250/227; 350/96.15; 350/96.20; 350/96.21
[58] Field of Search ............... 350/96.15, 96.20, 96.21; 250/227; 357/74, 38, 30, 75

[56] References Cited

U.S. PATENT DOCUMENTS

| 4,307,934 | 12/1981 | Palmer ................................. 357/74 |
| 4,368,481 | 1/1983 | Ohashi et al. ........................ 357/38 |
| 4,466,009 | 8/1984 | Konishi et al. ..................... 350/96.15 |

FOREIGN PATENT DOCUMENTS

| 0054300 | 6/1982 | European Pat. Off. .............. 357/30 |
| 55-117285 | 9/1980 | Japan .................. 350/96.17 |
| 57-128081 | 8/1982 | Japan .................. 357/30 |
| 58-28844 | 2/1983 | Japan .................. 357/30 |

OTHER PUBLICATIONS

Konishi et al, "High-Power Light Activated Thyristors", IPEC, Tokyo 1983, pp. 559–570.

Primary Examiner—Andrew J. James
Assistant Examiner—Jerome Jackson
Attorney, Agent, or Firm—Hill, Van Santen, Steadman & Simpson

[57] ABSTRACT

A light-triggerable thyristor comprises a cathode contact and a light conductor arranged in a bore thereof for supplying trigger energy. In order to obtain optimally low losses of the trigger energy and to guarantee simple assembly and interchangeability, the end of the light conductor at the side of the thyristor is surrounded by a rigid sleeve which is pluggable into a sleeve-shaped insert mounted in the bore. In particular, a central region of the cathode contact is fashioned raised in comparison to a flange-like projection of the cathode contact which is connected to a ceramic envelope, and the central region is provided with a groove which serves for receiving an angled portion of the rigid sleeve. The invention is particularly suited for power thyristors in high-voltage DC transmission systems.

19 Claims, 1 Drawing Sheet

LIGHT-TRIGGERABLE THYRISTOR HAVING LOW-LOSS FEED OF THE TRIGGER ENERGY

BACKGROUND OF THE INVENTION

1. Field of the Invention

The present invention relates to a light-triggerable thyristor which comprises a cathode portion and a light conductor serving for supplying trigger power arranged in a bore of the cathode portion, the light conductor being in optical communication with a light-sensitive region of the thyristor.

2. Description of the Prior Art

A thyristor of the type generally set forth above is known from the publication IPEC Conference, Volume 1983, pp. 559–570, fully incorporated herein by this reference. The trigger power is supplied from a light source, for example from a light-emitting diode, via a flexible light conductor whose end is secured to the housing of the thyristor such that its output is located in front of a window which is inserted gas-tight into the housing jacket. Within the housing, the trigger power is forwarded via a bent light conductor rod extending from the window to a light-sensitive region of the thyristor, the rod being located in a recess of the cathode contact portion of the thyristor. What is disadvantageous with such an arrangement, however, is that the transmittable light power is reduced by the optical interfaces preceding and following the window, as well as by inaccuracies that are difficult to avoid in the mounting of the light conductor rod and of the flexible light conductor, this particular being of consequence because the available light sources must be operated in the region of the limit of power in order to exert the required trigger energy.

SUMMARY OF THE INVENTION

It is therefore the object of the present invention to provide a light-triggerable thyristor of the type generally set forth above which can be charged with an optimally high trigger energy without requiring an acceptance of great transmission losses.

The above object is achieved, according to the present invention, in a light-triggerable thyristor comprising a cathode contact portion and a light conductor serving for supplying trigger energy, the light conductor arranged in a bore of the cathode portion and being in optical communication with a light-sensitive region of the thyristor, the thyristor being particularly characterized in that a sleeve-shaped insert is inserted into the bore, in that the end of the light conductor at the side of the thyristor is surrounded by a rigid sleeve, in that the sleeve, or a portion thereof, at the side of the thyristor roughly corresponds in length to that of the bore of the cathode contact portion, and in that the sleeve or the portion thereof is pluggable into the bore and into the sleeve-shaped insert.

The advantage attained in practicing the present invention is, in particular, that by reducing the number of optical interfaces and, due to the self-adjustment of the light conductor in the sleeve-shaped insert, a significantly greater portion of the available light energy can be supplied to the light-sensitive region of the thyristor than was heretofore possible. Furthermore, the assembly of such a thyristor is considerably facilitated.

An attendant object is to guarantee a simple assembly and interchangeability of the thyristor within the framework of a column structure of a plurality of identical thyristors.

The above attendant object is achieved, in a structure of the type set forth above, which is further characterized in that the cathode contact part comprises a flange-like projection which is welded or soldered gas-tight to a ceramic envelope, in that a central region of the cathode contact portion is raised in comparison to the flange-like portion, in that an external surface of the central region is provided with a groove-like recess which communicates with the bore, and in that the sleeve is essentially accepted by the recess in the plugged condition of an angular portion thereof which extends at an angle to the plug-in portion.

BRIEF DESCRIPTION OF THE DRAWING

Other objects, features and advantages of the invention, its organization, construction and operation will be best understood from the following detailed description, taken in conjunction with the accompanying drawing, on which.

DESCRIPTION OF THE PREFERRED EMBODIMENTS

Figure 1:
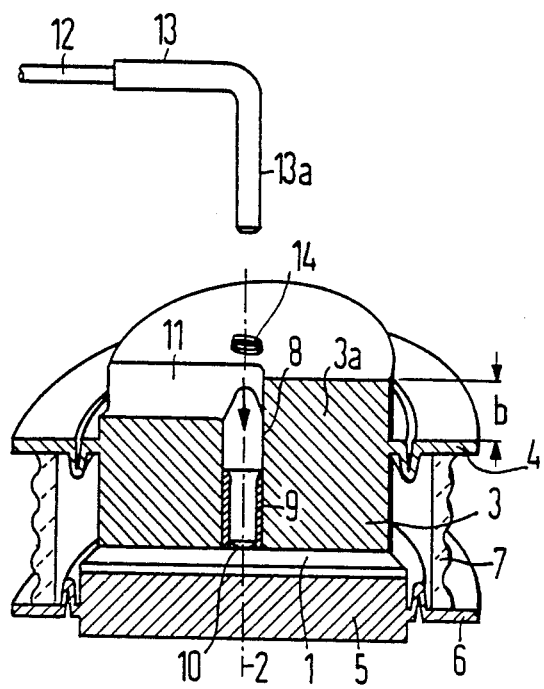
FIG. 1 is an exploded sectional view of a light-triggerable thyristor constructed in accordance with the present invention.

Referring to FIG. 1, a cross sectional view is shown as taken through the overall structure of a light-triggerable, high-performance thyristor fashioned in accordance with the present invention. A known thyristor tablet 1, i.e. a body of doped semiconductor material, for example silicon, is provided, which comprises four successive layers of alternating conductivity type (n-emitter, p-base, n-base, p-emitter). The tablet 1 is beveled at its edge side in order to enhance its dielectric strength. It forms a flat wafer which is dynamically balanced relative to an axis 2. The contacting of the n-emitter occurs via a cathode contact portion which may be provided with a first terminal (not shown) of a load circuit and which has a flange-like projection 4. The p-emitter is in communication with an anode contact 5, which is provided with a flange-like projection 6. The anode contact 5 may comprise a second terminal (not shown) for the load circuit. A cylindrical ceramic envelope 7 is welded to the flange-like projections 4 and 6, preferably in a gas-tight manner. A cooling member can be provided in a known manner above the element 3, such a cooling member having good thermal contact with the element 3, as well as with the thyristor tablet 1.

In the region of the axis 2, the cathode contact 3 is provided with a bore 8 extending essentially perpendicular with respect to the horizontal principle faces of the thyristor tablet 1, a sleeve-shaped, particularly metallic, insert 9 being inserted into the bore 8. Advantageously, the insert 9 which is composed of brass, for example, is provided with a transparent terminating portion 10 at its lower end which can be fashioned as a plano-parallel or as a plano-convex positive lens. The terminating portion 10 is thereby fitted into the insert 9 in a gas-tight manner, the insert 9 being, in turn, soldered or welded into the bore 8 in a gas-tight manner.

A central region 3a of the cathode contact 3 is fashioned elevated relative to the flange-like projection 4 by a distance b, as shown in FIG. 1. This region is provided with a groove-shaped recess 11 which extends into the cathode contact from the upper boundary surface, as shown in FIG. 1, and which essentially comprises a constant depth. The recess extends from the lateral edge of the portion 3a up to the center thereof where it communicates with the bore 8.

A light conductor 12 which is surrounded by a rigid sleeve 13 at one end serves the purpose of supplying the trigger energy. The sleeve 13 comprises an angled portion 13a at the side of the thyristor, the angled portion extending at an angle of about 90° relative to the remainder of the sleeve. The end of the light conductor 12 thereby coincides with the end of the portion 13a at the thyristor side. The length of the portion 13a is matched to the length of the bore 8 to such a degree that the end of the light conductor 12 extends as close as possible to the terminating portion 10, whereby the outer diameter of the sleeve 13 is selected such that its end at the thyristor side can be plugged into the sleeve-shaped insert 9 without lateral play. In its plugged condition, the non-angled portion of the sleeve 13 is then essentially accepted by the groove-like recess 11. Advantageously, the recess 11 has a resilient element, for example a helical spring 14 located therein such that it presses against the inserted sleeve 13 from above and fixes the light conductor 12 into its working position relative to the terminating element 10, wherein the end of the light conductor 12 has been brought optimally close to the terminating element 10. In case a cooling member is provided, the same lies against the upper surface of the central region 3a, and the resilient element is advantageously supported against the underside of the cooling member.

The cathode and anode contacts 3, 5 connected to the ceramic envelope 7 via the flange-like projections 4 and 6 form the gas-tight housing for the thyristor tablet 1, whereby the bore 8 is likewise closed gas-tight by the cylindrical insert 9 and the terminating element 10. By plugging the light conductor 12, provided with the sleeve 13, into the insert 9, one succeeds in bringing the light conductor 12 into good optical communication with the thyristor tablet 1 without screw-tight connections that are complicated to assemble, so that a large portion of the trigger energy supplied via the light conductor 12 is available for the ignition of the thyristor. As a consequence of the reduction of the optical losses which is obtainable with the present invention, the light sources exerting the trigger energy no longer have to be operated in their absolute power limit region, this improving their aging behavior and, therefore, significantly enhancing the readiness of both an individual thyristor arrangement and that of a plurality of such arrangements which are combined in a column-like structure. The replacement of a single such thyristor arrangement within a column-like structure can occur in a simple manner by laterally pushing out the structural unit composed of the elements 1–11. After the light conductor 12, provided with the sleeve 13 has been withdrawn, the former is then plugged into the insert 9 of a new, correspondingly-fashioned structural unit, whereupon the same is then laterally inserted into the column.

Figure 2:
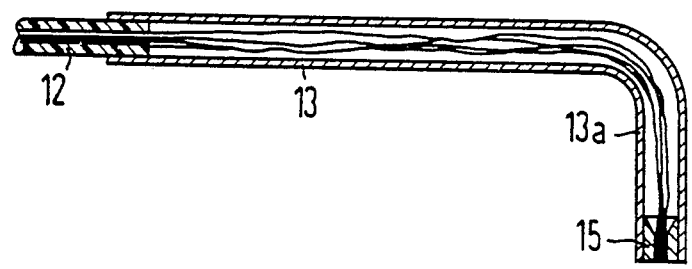
FIG. 2 is a sectional view of a light conductor which serves for supplying the trigger energy for the thyristor of FIG. 1.

FIG. 2 illustrates a preferred embodiment of a light conductor 12 which is provided with a rigid sleeve 13. The sleeve 13, which is composed of metal, for example brass, thereby first has one end slipped onto the plastic jacket of the light conductor 12 so that the light conductor extends through the sleeve 13, the light conductor first having an end thereof stripped of the jacket. As shown, the light conductor is composed of a fiber bundle. The end of the sleeve at the thyristor side is provided with a terminating portion 15 which is penetrated in the central region of its cross section by the light conductor. A hardenable sealing compound, for example an epoxy resin compound, can be filled into the sleeve 13 for high voltage stabilization.

Deviating from the embodiments of the invention set forth above, the angled portion 13a can also be eliminated from the rigid sleeve 13. In this case, the light conductor 12 is plugged into the bore and into the insert 9 from above, this, however, no longer permitting the use of the thyristors in a column-like structure comprising a plurality of identical thyristors.

Although we have described our invention by reference to a particular embodiment thereof, many changes and modifications of the invention may become apparent to those skilled in the art without departing from the spirit and scope thereof. We therefore intend to include within the patent warranted hereon all such changes and modifications as may reasonably and properly be included within the scope of our contribution to the art.

We claim:

1. A light triggerable thyristor comprising:
   a thyristor tablet, and a cathode contact and an anode contact sandwiching said thyristor tablet therebetween;
   a bore extending through said cathode contact and a sleeve-shaped insert in said bore;
   a light conductor for carrying trigger energy, and a sleeve covering said light conductor and including an end section to be plugged into said sleeve-shaped insert;
   said cathode contact and said anode contact each including a peripheral flange, and a ceramic envelope connected gas-tight between said flanges;
   said cathode contact comprising a cathode contact section extending longitudinally beyond its flange, and a groove in said cathode contact section extending from and communicating its periphery with said bore; and
   said sleeve including a further section adjacent and at an angle to said end section and received in said groove.

2. The light-triggerable thyristor of claim 1, wherein:
   said end section of said sleeve comprises a terminating element therein with said light conductor centrally located in and extending through said terminating element.

3. The light-triggerable thyristor of claim 2, wherein:
   said light conductor comprises fibers and a jacket over said fibers, said jacket having been removed from the section of the fibers which are in said sleeve; and
   said sleeve comprises a hardenable casting compound filling the volume transversed by the unjacketed fibers.

4. The light-triggerable thyristor of claim 3, wherein:
   said compound comprises an epoxy resin compound.

5. The light-triggerable thyristor of claim 1, and further comprising:
   a transparent element mounted in said sleeve-shaped insert immediately adjacent said thyristor tablet and receiving the end of said light conductor in close proximity.

6. The light-triggerable thyristor of claim 5, wherein:

said transparent element comprises a lens.

7. The light-triggerable thyristor of claim 5, wherein:
said transparent element comprises a plano-parallel lens.

8. The light-triggerable thyristor of claim 5, wherein:
said transparent element comprises a plano-convex lens.

9. The light-triggerable thyristor of claim 5, wherein:
said transparent element is sealed gas-tight to said sleeve-like insert and said sleeve like insert is sealed gas-tight to said cathode contact.

10. The light-triggerable thyristor of claim 1, wherein the thyristor is dynamically balanced and the cathode contact has an axis of symmetry, and wherein:
said bore extends along the axis of symmetry.

11. The light-triggerable thyristor of claim 1, and further comprising:
a ceramic sleeve about said thyristor tablet, said cathode contact and said anode contact sealed to said ceramic sleeve to provide a gas-tight housing.

12. The light-triggerable thyristor of claim 1, and further comprising:
a cooling member connected to said cathode contact.

13. The light-triggerable thyristor of claim 1, and further comprising:
a resilient member in said groove securing said sleeve and defining the working position of said light conductor.

14. The light-triggerable thyristor of claim 13, wherein:
said resilient member comprises a helical spring.

15. The light-triggerable thyristor of claim 13, and further comprising:
a cooling member connected to said cathode contact and bearing against said resilient member.

16. A light-triggerable thyristor comprising:
a thyristor tablet, an annular cathode contact and an annular anode contact sandwiching said thyristor tablet therebetween, said cathode contact and said anode contact each including a peripheral flange, and a ceramic envelope between and sealed gas-tight to said cathode and anode contacts;
an axial bore extending through said cathode contact, and a sleeve-like insert in said bore and sealed gas-tight to said cathode contact;
a groove in said cathode contact extending from the periphery thereof to and into communication with said bore; and
a pluggable light conductor to be releasably received in said sleeve-like insert and into said groove, said pluggable light conductor comprising a sleeve including first and second ends, light conducting fibers for carrying trigger energy for said thyristor extending through said sleeve, a jacket covering said fibers and extending into and sealed to said first end of said sleeve, a terminating element in and sealing said second end of said sleeve with said fibers extending therethrough, a hardening casting compound filling said sleeve between said jacket and said terminating element, said sleeve including a first portion to be plugged into said insert and a second portion at an angle to said first portion to be received in said groove.

17. The light-triggerable thyristor of claim 16, wherein:
said casting compound comprises an epoxy resin.

18. The light-triggerable thyristor of claim 16, and further comprising:
a spring in said groove securing said sleeve.

19. The light-triggerable thyristor of claim 16, wherein:
said angle is 90°.

* * * * *